US011193962B2

(12) United States Patent
Sim et al.

(10) Patent No.: US 11,193,962 B2
(45) Date of Patent: Dec. 7, 2021

(54) ELECTRONIC CIRCUIT FOR GENERATING REFERENCE VOLTAGE

(71) Applicant: POSTECH Research and Business Development Foundation, Pohang-Si (KR)

(72) Inventors: Jae Yoon Sim, Pohang-si (KR); Young Woo Ji, Seoul (KR)

(73) Assignee: POSTECH RESEARCH AND BUSINESS DEVELOPMENT FOUNDATION, Gyeonsangbuk-Do (KR)

(*) Notice: Subject to any disclaimer, the term of this patent is extended or adjusted under 35 U.S.C. 154(b) by 0 days.

(21) Appl. No.: 16/848,153

(22) Filed: Apr. 14, 2020

(65) Prior Publication Data

US 2020/0393500 A1 Dec. 17, 2020

(30) Foreign Application Priority Data

Jun. 11, 2019 (KR) .................. 10-2019-0068501

(51) Int. Cl.
*G05F 3/02* (2006.01)
*G01R 19/165* (2006.01)
(Continued)

(52) U.S. Cl.
CPC ....... *G01R 19/16576* (2013.01); *G01R 19/17* (2013.01); *G05F 3/10* (2013.01)

(58) Field of Classification Search
CPC ..... G05F 3/02; G05F 3/08; G05F 3/10; G05F 3/16; G05F 3/20; G05F 3/22; G05F 3/222;
(Continued)

(56) References Cited

U.S. PATENT DOCUMENTS 5,369,354 A * 11/1994 Mori .................. G05F 3/24
323/313
5,545,977 A 8/1996 Yamada et al.
(Continued)

FOREIGN PATENT DOCUMENTS

JP H0676571 A 3/1994

OTHER PUBLICATIONS

2019 IEEE International Solid-State Circuits Conference, IEEE solid-state circuits society, Conference theme: Envisioning the Future, published Feb. 2019.

*Primary Examiner* — Long Nguyen
(74) *Attorney, Agent, or Firm* — Harness, Dickey & Pierce, P.L.C.

(57) ABSTRACT

An electronic circuit includes first to third transistors. The first transistor has a first channel width and a first channel length and generates a first potential difference by passing an operating current based on a first operating voltage. The second transistor has a second channel width and a second channel length and generates a second potential difference based on the operating current. The third transistor generates a third potential difference based on a second operating voltage and the operating current. A sum of a level of the first operating voltage and a level of the first potential difference corresponds to a sum of a level of the second operating voltage, a level of the second potential difference, and a level of the third potential difference. The first channel width is greater than the second channel width, or the first channel length is longer than the second channel length.

20 Claims, 7 Drawing Sheets

(51) Int. Cl.
*G01R 19/17* (2006.01)
*G05F 3/10* (2006.01)

(58) Field of Classification Search
CPC . G05F 3/225; G05F 3/227; G05F 3/24; G05F 3/242; G05F 3/245; G05F 3/247; H03K 3/011; H03K 17/14; H03K 17/145; H03K 19/00369; G01R 19/16576; G01R 19/17
See application file for complete search history.

(56) References Cited

U.S. PATENT DOCUMENTS 7,843,253 B2 * 11/2010 Aota ............... G11C 5/147
                                                      327/538
10,019,026 B2     7/2018 Ippolito et al.

* cited by examiner

ELECTRONIC CIRCUIT FOR GENERATING REFERENCE VOLTAGE

CROSS-REFERENCE TO RELATED APPLICATIONS

This application claims priority under 35 U.S.C. § 119 to Korean Patent Application No. 10-2019-0068501 filed on Jun. 11, 2019, in the Korean Intellectual Property Office, the disclosures of which are incorporated by reference herein in their entireties.

BACKGROUND

Embodiments of the inventive concept described herein relate to an electronic circuit, and more particularly, relate to an electronic circuit for generating a reference voltage.

Mobile devices include various semiconductor elements. A process error may occur due to various causes in the process of manufacturing a semiconductor element. In the case where the process error occurs, a physical characteristic of the semiconductor element may change. For example, due to the process error, the semiconductor element may have a characteristic value different from a characteristic value intended by a designer.

A reference voltage generating circuit may provide a reference voltage necessary for an operation of an electronic device. For example, a reference voltage generating circuit is classified as a reference voltage generating circuit generating a reference voltage based on a bandgap energy voltage of silicon or a reference voltage generating circuit generating a reference voltage based on a threshold voltage of a transistor. The reference voltage generating circuit may include various semiconductor elements. A characteristic value of the semiconductor elements constituting the reference voltage generating circuit may have an error due to a process error.

In the case where the characteristic value of the semiconductor elements constituting the reference voltage generating circuit includes an error, the reference voltage generating circuit may generate a reference voltage having an unstable level. In the case where the level of the reference voltage is unstable, an operation of an electronic device using the reference voltage may be unstable. Accordingly, there is required a design of a reference voltage generating circuit configured to output a reference voltage having a stable level regardless of a process error.

SUMMARY

Embodiments of the inventive concept provide an electronic circuit for generating a reference voltage having a stable level against a process error, a temperature change, and a change in a level of an operating voltage.

According to an exemplary embodiment, an electronic circuit may include a first transistor, a second transistor, and a third transistor. The first transistor may have a first channel width and a first channel length and may generate a first potential difference by passing an operating current based on a first operating voltage. The second transistor may have a second channel width and a second channel length and may generate a second potential difference based on the operating current. The third transistor may generate a third potential difference based on a second operating voltage and the operating current. A sum of a level of the first operating voltage and a level of the first potential difference may correspond to a sum of a level of the second operating voltage, a level of the second potential difference, and a level of the third potential difference. The first channel width may be greater than the second channel width, or the first channel length may be longer than the second channel length.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Figure 1:
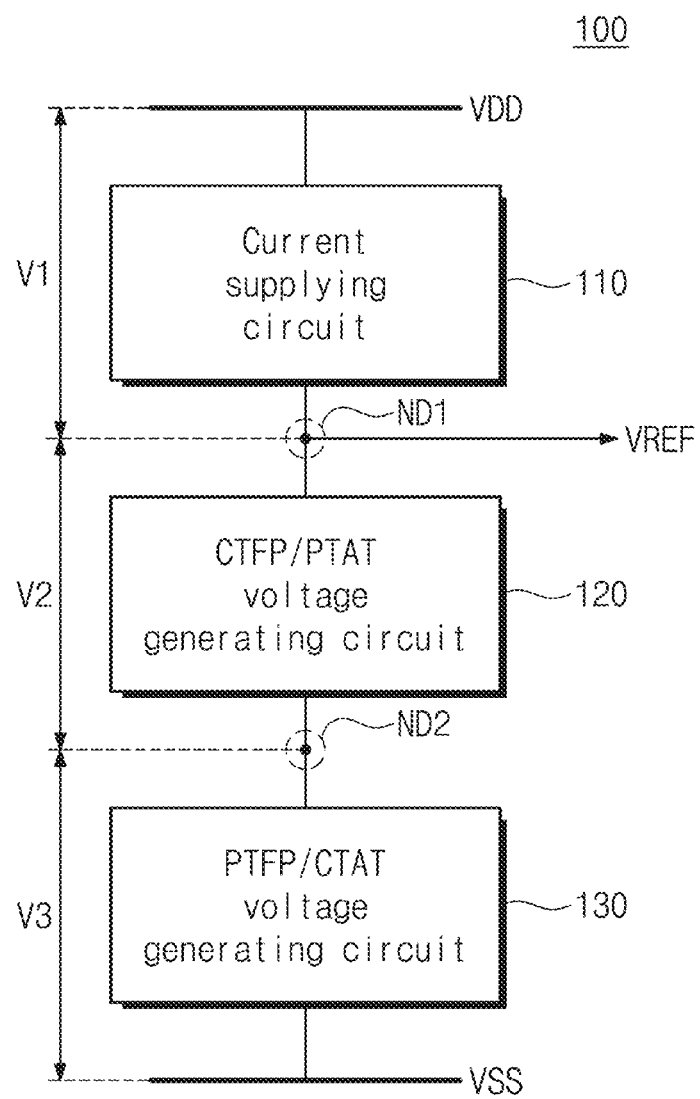
FIG. 1 is a block diagram illustrating a voltage generating circuit according to an embodiment of the inventive concept.

Hereinafter, embodiments of the inventive concept are described in detail with reference to the accompanying drawings. In the following description, specific details such as detailed components and structures are merely provided to assist the overall understanding of the embodiments of the inventive concept. Therefore, it should be apparent to those skilled in the art that various changes and modifications of the embodiments described herein may be made without departing from the scope and spirit of the present invention. In addition, descriptions of well-known functions and structures are omitted for clarity and conciseness. The terms described below are terms defined in consideration of the functions in the inventive concept and are not limited to a specific function. The definitions of the terms should be determined based on the contents throughout the specification.

In the following drawings or in the detailed description, circuits may be connected with any other components in addition to components illustrated in drawings or disclosed in the detailed description. Connections between circuits or components may be direct or indirect. Circuits or components may be connected through respective communication or may be physically connected.

Unless otherwise defined, all terms used herein, which include technical terminologies or scientific terminologies, have the same meaning as that understood by a person skilled in the art to which the present invention belongs. Terms defined in a generally used dictionary are to be interpreted to have meanings equal to the contextual meanings in a relevant technical field, and are not interpreted to have ideal or excessively formal meanings unless clearly defined in the specification.

In the specification, a "fast process" means that a semiconductor element is manufactured based on a wafer having a characteristic value different from a characteristic value intended by a designer. For example, the fast process means that a semiconductor element is manufactured based on a wafer having dopant concentration lower than dopant concentration intended by the designer. Below, in the specification, that a process error due to a fast process is great means that an error of an element value of a manufactured semiconductor element (i.e., a difference between an element value intended by the designer and an element value of an actually manufactured semiconductor element) is great as a semiconductor manufacturing process is performed on a wafer having dopant concentration lower than dopant concentration intended by the designer. However, it may be understood that a process error due to a fast process may mean an error occurring due to various types of characteristic values in addition to the dopant concentration. Below, for convenience of description, a process error due to a fast process is referred to as a "fast process error". For example, as a fast process error of a transistor increases, a level of a threshold voltage of the transistor may become lower than a level of a threshold voltage intended by the designer.

In the specification, a "slow process" means that a semiconductor element is manufactured based on a wafer having a characteristic value different from a characteristic value intended by the designer. For example, the slow process means that a semiconductor element is manufactured based on a wafer having dopant concentration higher than dopant concentration intended by the designer. Below, in the specification, that a process error due to a slow process is great means that an error of an element value of a manufactured semiconductor element (i.e., a difference between an element value intended by the designer and an element value of an actually manufactured semiconductor element) is great as a semiconductor manufacturing process is performed on a wafer having dopant concentration higher than dopant concentration intended by the designer. However, it may be understood that a process error due to a slow process may mean an error occurring due to various types of characteristic values in addition to the dopant concentration. Below, for convenience of description, a process error due to a slow process is referred to as a "slow process error". For example, as a slow process error of a transistor increases, a level of a threshold voltage of the transistor may become higher than a level of a threshold voltage intended by the designer.

In the specification, a level of a voltage may be expressed by using a symbol of the voltage. For example, a level of a voltage Vx may be marked by "Vx". In the specification, the expression "a level is uniform" means that a level does not change or that a level minutely changes but is uniform on the whole. In the specification, a voltage formed at a node included in an electronic circuit is expressed by a "node voltage".

FIG. 1 is a block diagram illustrating a voltage generating circuit according to an embodiment of the inventive concept.

Referring to FIG. 1, a voltage generating circuit 100 may include a current supplying circuit 110, a complementary to faster process (CTFP)/proportional to absolute temperature (PTAT) voltage generating circuit 120, and proportional to faster process (PTFP)/complementary to absolute temperature (CTAT) voltage generating circuit 130

The voltage generating circuit 100 may receive operating voltages VDD and VSS. For example, the voltage generating circuit 100 may receive the operating voltages VDD and VSS from an electronic device such as a voltage generator outside the voltage generating circuit 100. The operating voltages VDD and VSS may respectively have appropriate levels that are set for operations of the voltage generating circuit 100 (e.g., operations of transistors constituting the voltage generating circuit 100). For example, the operating voltage VSS may be a ground voltage. A level of the operating voltage VDD may be higher than a level of the operating voltage VSS.

The current supplying circuit 110 may provide a current for operations of the CTFP/PTAT voltage generating circuit 120 and the PTFP/CTAT voltage generating circuit 130 based on the operating voltage VDD. The current supplying circuit 110 may include one or more transistors for providing a current.

For example, the transistors of the current supplying circuit 110 may operate in a turned-off state. As the operating voltage VDD is supplied to the current supplying circuit 110, a leakage current may flow through the transistors of the turned-off state. As a leakage current flows from the current supplying circuit 110 to the CTFP/PTAT voltage generating circuit 120, a potential difference V1 may be formed across the current supplying circuit 110, that is, between a supply terminal of the operating voltage VDD and a node ND1.

For the voltage generating circuit 100 to operate stably, the operating voltage VDD having a level that is uniformly maintained may be required. However, the level of the operating voltage VDD may fluctuate while the operating voltage VDD is being supplied from the outside of the voltage generating circuit 100. In the specification, that the voltage generating circuit 100 operates stably means that the voltage generating circuit 100 outputs a reference voltage VREF having a level that is uniformly maintained.

The current supplying circuit 110 may be configured to form a node (ND1) voltage having a uniform level over time even though the level of the operating voltage VDD fluctuates. Because the reference voltage VREF is output from the node ND1, the current supplying circuit 110 may allow the reference voltage VREF to have a uniform level over time. That is, the level of the reference voltage VREF may be stable relative to the operating voltage VDD. Exemplary operations of the current supplying circuit 110 will be more fully described with reference to FIGS. 4 and 5.

The CTFP/PTAT voltage generating circuit 120 may generate a potential difference V2 between the node ND1 and a node ND2, based on a node (ND2) voltage. Each of the current supplying circuit 110, the CTFP/PTAT voltage generating circuit 120, and the PTFP/CTAT voltage generating circuit 130 may include one or more transistors. As the fast process error of the transistors constituting the voltage generating circuit 100 increases (or the slow process error of the transistors decreases), a level of the potential difference V2 may decrease. Also, as a temperature increases, the potential difference V2 may increase.

In the specification, a temperature means an internal temperature of an electronic device including the voltage generating circuit 100 or an internal temperature of components constituting the voltage generating circuit 100. For example, the electronic device including the voltage generating circuit 100 may be one of a personal computer (PC), a workstation, a notebook computer, a mobile device, etc.

The PTFP/CTAT voltage generating circuit 130 may generate a potential difference V3 between the node ND2 and a supply terminal of the operating voltage VSS, based on the node (ND2) voltage and the operating voltage VSS. As the fast process error of the transistors constituting the voltage generating circuit 100 increases, a level of the potential difference V3 may increase. Also, as a temperature increases, the potential difference V3 may decrease.

As described with reference to the current supplying circuit 110, the CTFP/PTAT voltage generating circuit 120, and the PTFP/CTAT voltage generating circuit 130, the potential differences V1 to V3 may be generated between the supply terminals of the operating voltages VDD and VSS. The reference voltage VREF may be formed at the node ND1, based on the potential differences V1 to V3. The level of the reference voltage VREF may correspond to a sum of the level of the potential difference V2, the level of the potential difference V3, and a level of the operating voltage VSS.

As the fast process error increases, the level of the potential difference V2 may decrease, and the level of the potential difference V3 may increase. This may mean that the decrement of the level of the potential difference V2 and the increment of the level of the potential difference V3 are canceled out. Accordingly, even though the fast process error changes, the level of the reference voltage VREF may be uniform. That is, the level of the reference voltage VREF may be stable relative to the process error. Exemplary changes of the level of the potential difference V2, the level of the potential difference V3, and the level of the reference voltage VREF due to the process error will be more fully described with reference to FIGS. 6 to 9.

As a temperature increases, the level of the potential difference V2 may increase, and the level of the potential difference V3 may decrease. This may mean that the increment of the level of the potential difference V2 and the decrement of the level of the potential difference V3 are canceled out. Accordingly, even though the temperature changes, the level of the reference voltage VREF may be uniform. That is, the level of the reference voltage VREF may be stable relative to the temperature. Exemplary changes of the level of the potential difference V2, the level of the potential difference V3, and the level of the reference voltage VREF due to a temperature change will be more fully described with reference to FIG. 10.

For example, the reference voltage VREF may be output to any other component of an electronic device including the voltage generating circuit 100 or any other electronic device outside the electronic device including the voltage generating circuit 100. Because the reference voltage VREF is stable relative to a process error, a temperature, and the operating voltage VDD, the reference voltage VREF may be used to perform various operations of the electronic device stably.

In an exemplary embodiment, unlike to illustrated as FIG. 1, the CTFP/PTAT voltage generating circuit 120 and the PTFP/CTAT voltage generating circuit 130 may be interchanged with each other. For example, the PTFP/CTAT voltage generating circuit 130 may be interposed between the node ND1 and the node ND2. The CTFP/PTAT voltage generating circuit 120 may be interposed between the node ND2 and the operating voltage VSS. Despite the interchange of the circuits 120, 130, the reference voltage VREF may be constant as the sum of the level of the potential difference V2, the level of the potential difference V3, and the level of the operating voltage VSS.

Figure 2:
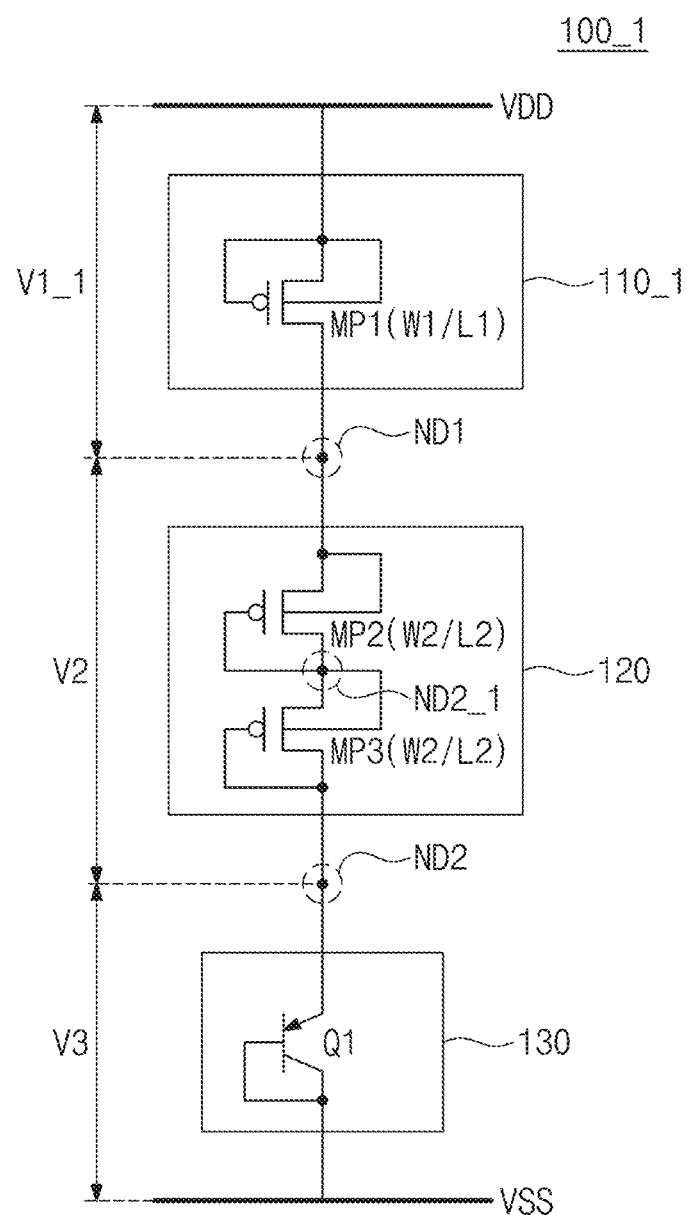
FIG. 2 is a circuit diagram illustrating an exemplary configuration of a voltage generating circuit of FIG. 1.

FIG. 2 is a circuit diagram illustrating an exemplary configuration of a voltage generating circuit of FIG. 1.

A voltage generating circuit 100_1 of FIG. 2 may include a current supplying circuit 110_1, the CTFP/PTAT voltage generating circuit 120, and the PTFP/CTAT voltage generating circuit 130. The current supplying circuit 110 of FIG. 1 may include the current supplying circuit 110_1 of FIG. 2.

A potential difference V1_1 may correspond to the potential difference V1 of FIG. 1. The current supplying circuit 110_1 may include a transistor MP1. The CTFP/PTAT voltage generating circuit 120 may include transistors MP2 and MP3. The PTFP/CTAT voltage generating circuit 130 may include a transistor Q1.

For example, the transistor MP1 may be implemented with a P-type metal oxide semiconductor field effect transistor (MOSFET), and each of the transistors MP2 and MP3 may be implemented with a P-type MOSFET, and the transistor Q1 may be implemented with a bipolar junction transistor (BJT). The transistor Q1 implemented with the BJT will be described with reference to FIGS. 2 and 3, but it may be understood that the transistor Q1 may be implemented with another type of transistor (e.g., an MOSFET) for performing operations of the transistor Q1 to be described below. A channel width of the transistor MP1 may be "W1", and a channel length of the transistor MP1 may be "L1". A channel width of the transistors MP2 and MP3 may be "W2", and a channel length of the transistors MP2 and MP3 may be "L2".

A gate terminal of the transistor MP1 may be connected with the supply terminal of the operating voltage VDD. A body of the transistor MP1 may be connected with the supply terminal of the operating voltage VDD. The transistor MP1 may be connected between the supply terminal of the operating voltage VDD and the node ND1. A current may flow through the transistor MP1 based on the operating voltage VDD. The potential difference V1_1 may be generated between the supply terminal of the operating voltage VDD and the node ND1, based on the current flowing through the transistor MP1.

A gate terminal of the transistor MP2 may be connected with a node ND2_1. A body of the transistor MP2 may be connected with the node ND1. The transistor MP2 may be connected between the node ND1 and the node ND2_1. A gate terminal of the transistor MP3 may be connected with the node ND2. A body of the transistor MP3 may be connected with the node ND2_1. The transistor MP3 may be connected between the node ND2_1 and the node ND2.

A current flowing through the current supplying circuit 110_1 may be received through the node ND1. The current received through the node ND1 may flow to the node ND2 through the transistors MP2 and MP3. The potential difference V2 may be generated between the nodes ND1 and ND2, based on the current flowing through the transistors MP2 and MP3.

A base of the transistor Q1 may be connected with the supply terminal of the operating voltage VSS. The transistor Q1 may be connected between the node ND2 and the supply terminal of the operating voltage VSS. A current flowing through the transistors MP2 and MP3 may be received through the node ND2. The current received through the node ND2 may flow to the supply terminal of the operating voltage VSS through the transistor Q1. The potential difference V3 may be generated between the node ND2 and the supply terminal of the operating voltage VSS, based on the current flowing through the transistor Q1.

An element value of the transistor MP1 may be different from element values of the transistor MP2 and MP3. For example, "W1" being the channel width of the transistor MP1 may be greater than "W2" being the channel width of the transistors MP2 and MP3, and "L1" being the channel length of the transistor MP1 may be longer than "L2" being the channel length of the transistors MP2 and MP3. As the channel widths and the channel lengths of the transistor MP1 and the transistors MP2 and MP3 are decided, the voltage generating circuit 100_1 may output the reference voltage VREF having a stable level relative to a process error.

For better understanding, the description is given as the channel widths and the channel lengths of the transistors MP2 and MP3 are identical, but it may be understood that each of the transistors MP2 and MP3 has a channel width smaller than the channel width of the transistor MP1 and has a channel length shorter than the channel length of the transistor MP1.

In an exemplary embodiment, unlike to illustrated as FIG. 2, the PTFP/CTAT voltage generating circuit 130 may be connected inside the CTFP/PTAT voltage generating circuit 120. For example, the transistor Q1 may be connected between the transistors MP2 and the transistors MP3. In this case, the node ND2 may be directly connected to the operating voltage VSS. Despite the variation of the connection of the circuits 120, 130, a level of voltage of the node ND1 may be constant as the sum of the level of the potential difference V2, the level of the potential difference V3, and the level of the operating voltage VSS.

Figure 3:
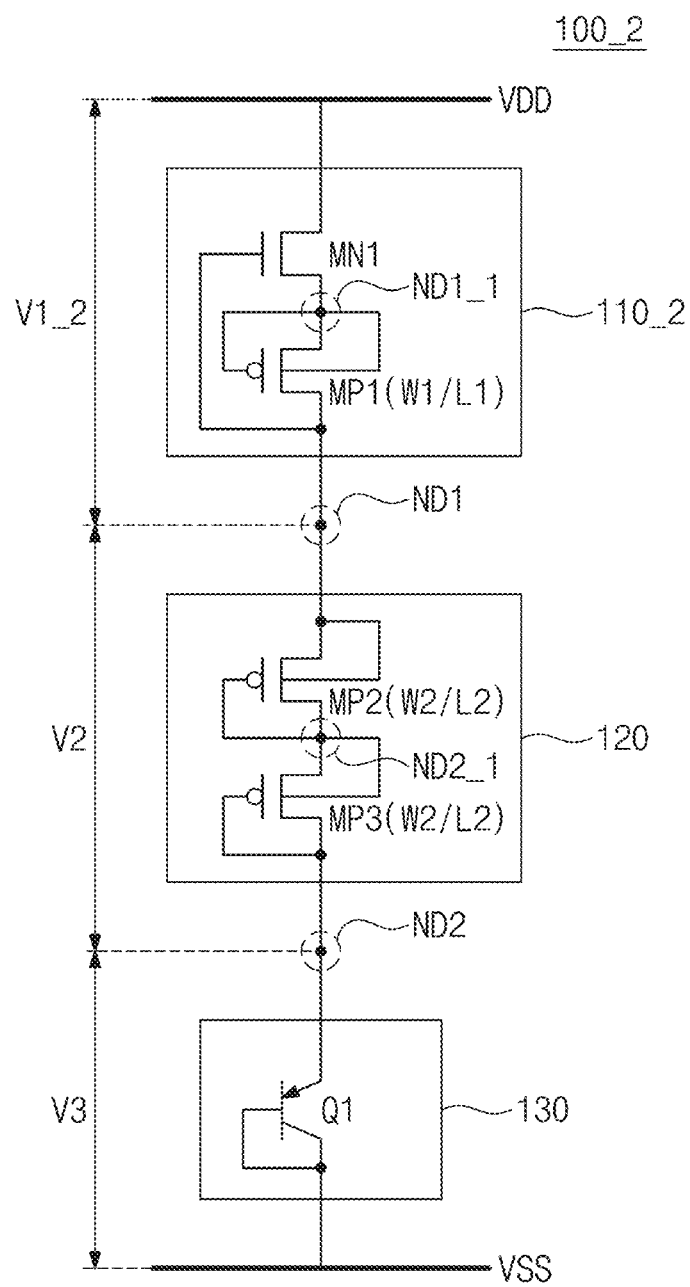
FIG. 3 is a circuit diagram illustrating an exemplary configuration of a voltage generating circuit of FIG. 1.

FIG. 3 is a circuit diagram illustrating an exemplary configuration of a voltage generating circuit of FIG. 1.

Referring to FIG. 3, a voltage generating circuit 100_2 may include a current supplying circuit 110_2, the CTFP/PTAT voltage generating circuit 120, and the PTFP/CTAT voltage generating circuit 130. The current supplying circuit 110 of FIG. 1 may include the current supplying circuit 110_2 of FIG. 3. A potential difference V1_2 of FIG. 3 may correspond to the potential difference V1 of FIG. 1. Compared with the current supplying circuit 110_1 of FIG. 2, the current supplying circuit 110_2 of FIG. 3 may further include a transistor MN1.

For example, the transistor MN1 may be implemented with an N-type MOSFET. A level of a threshold voltage of the transistor MN1 may be lower than levels of threshold voltages of the transistors MP1 to MP3. For example, the transistor MN1 may be implemented with a native N-type MOSFET having a small threshold voltage. The exemplary configurations and the exemplary operations of the CTFP/PTAT voltage generating circuit 120 and the PTFP/CTAT voltage generating circuit 130 are described with reference to FIG. 2, and thus, additional description will be omitted to avoid redundancy.

A gate terminal of the transistor MN1 may be connected with the node ND1. The transistor MN1 may be connected between the supply terminal of the operating voltage VDD and a node ND1_1. The gate terminal of the transistor MP1 may be connected with the node ND1_1. The body of the transistor MP1 may be connected with the node ND1_1. The transistor MP1 may be connected between the node ND1_1 and the node ND1. A current may flow through the transistor MN1 and MP1 based on the operating voltage VDD. The potential difference V1_2 may be generated between the supply terminal of the operating voltage VDD and the node ND1, based on the current flowing through the transistors MN1 and MP1.

Referring to FIG. 2 or 3, the potential differences V2 and V3 may have levels decided by Equation 1 and Equation 2 below.

$$V2 \cong (VTH2 - VTH1) + m2 \times VT\ln\left(\frac{W1 \times L2}{W2 \times L1}\right) \quad \text{[Equation 1]}$$

In Equation 1 and Equation 2, "VTH2" represents a level of a threshold voltage of the transistors MP2 and MP3, "VTH1" represents a level of a threshold voltage of the transistor MP1, "W1" represents a channel width of the transistor MP1, "W2" represents a channel width of the transistors MP2 and MP3, "L1" represents a channel length of the transistor MP1, "L2" represents a channel length of the transistors MP2 and MP3, "VT" represents a thermal voltage, and "m2" represents a subthreshold slope factor of the transistors MP2 and MP3.

In Equation 1, because "VT" is proportional to a temperature, $$\text{``}m2 \times VT\ln\left(\frac{W1 \times L2}{W2 \times L1}\right) m2 \times VT\ln\left(\frac{W1 \times L2}{W2 \times L1}\right) m2 \times VT\ln\left(\frac{L1 \times W1}{L2 \times W2}\right)\text{''}$$

may be proportional to a temperature. Accordingly, $$\text{``}m2 \times VT\ln\left(\frac{W1 \times L2}{W2 \times L1}\right) m2 \times VT\ln\left(\frac{W1 \times L2}{W2 \times L1}\right) m2 \times VT\ln\left(\frac{L1 \times W1}{L2 \times W2}\right)\text{''}$$

may be expressed by "VPTAT" proportional to a temperature.

$$V3 \cong \left(VBG - \frac{VTH1}{m1}\right) - VT\ln(k \times T^2) \quad \text{[Equation 2]}$$

In Equation 2, "V3" represents a level of the potential difference V3, "VTH1" represents a level of a threshold voltage of the transistor MP1, "k" represents a proportional constant, and "T" represents a temperature. "VBG" represents a bandgap voltage of a silicon element included in the transistor Q1, "VT" represents a thermal voltage, and "m1" represents a subthreshold slope factor of the transistor MP1.

Figure 4:
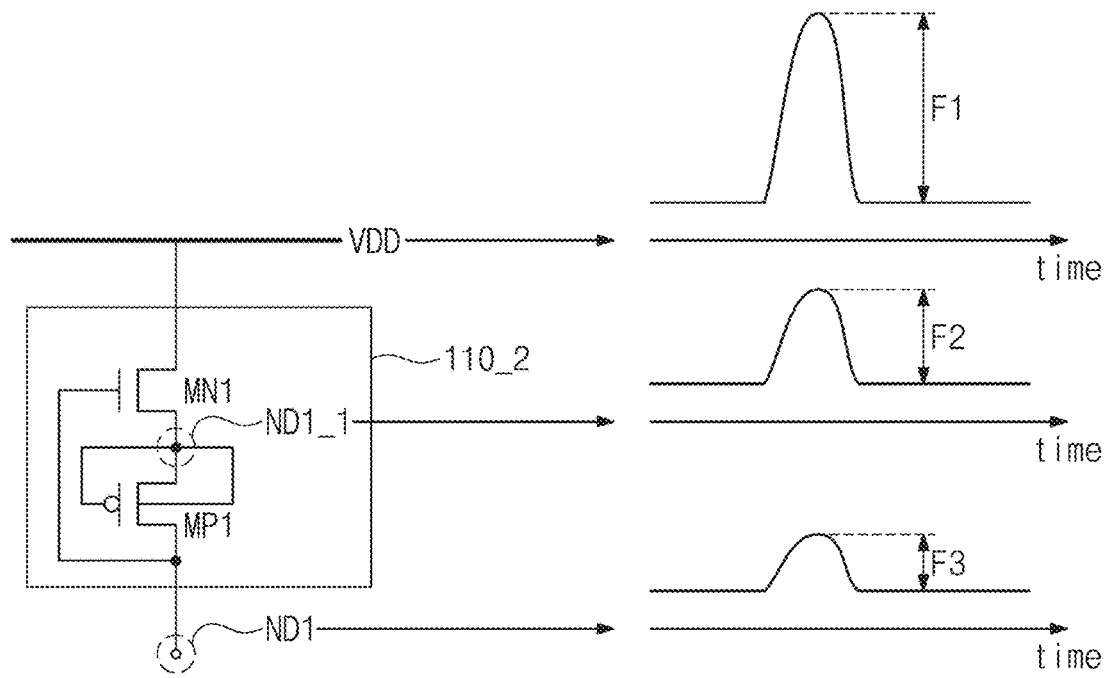
FIG. 4 is a conceptual diagram illustrating exemplary operations of a current supplying circuit of FIG. 3.

FIG. 4 is a conceptual diagram illustrating exemplary operations of a current supplying circuit of FIG. 3.

In an example of FIG. 4, the operating voltage VDD may fluctuate as much as level F1. As described with reference to FIGS. 2 and 3, a leakage current may flow through the transistor MN1 of a turned-off state. That is, the transistor MN1 may act as a resistor. Because a voltage is formed across the transistor MN1 (i.e., between the supply terminal of the operating voltage VDD and the node ND1_1) by the leakage current, energy that is transferred by the leakage current flowing through the transistor MN1 may be consumed by the transistor MN1.

Accordingly, the variation in a level of the node (ND1_1) voltage may be smaller than the variation in a level of the operating voltage VDD. In the example of FIG. 4, the level of the node (ND1_1) voltage may fluctuate as much as F2. Here, "F2" may be smaller than "F1".

A leakage current may flow from the transistor MP1 of a turned-off state. That is, the transistor MP1 may act as a resistor. Because a voltage is formed across the transistor MP1 (i.e., between the nodes ND1 and ND1_1) by the leakage current flowing through the transistor MP1, energy that is transferred by the leakage current may be consumed by the transistor MP1.

Accordingly, the variation in a level of the node (ND1) voltage (i.e., the reference voltage VREF) may be smaller than the variation in the level of the operating voltage VDD and the variation in a level of the node (ND1_1) voltage. In the example of FIG. 4, the level of the node (ND1) voltage may fluctuate as much as F3. Here, "F3" may be smaller than "F1" and "F2".

Compared with the current supplying circuit 110_1 of FIG. 2, the current supplying circuit 110_2 of FIG. 3 may further include the transistor MN1. When a level of the operating voltage VDD changes, the current supplying circuit 110_1 may decrease the variation in the node (ND1) voltage only through the transistor MP_1. The current supplying circuit 110_2 may decrease the variation in the node (ND1) voltage through the transistors MN1 and MP_1. Accordingly, the voltage generating circuit 100_2 including the current supplying circuit 110_2 may output the reference voltage VREF having a stable level relative to the operating voltage VDD to the node ND1.

Figure 5:
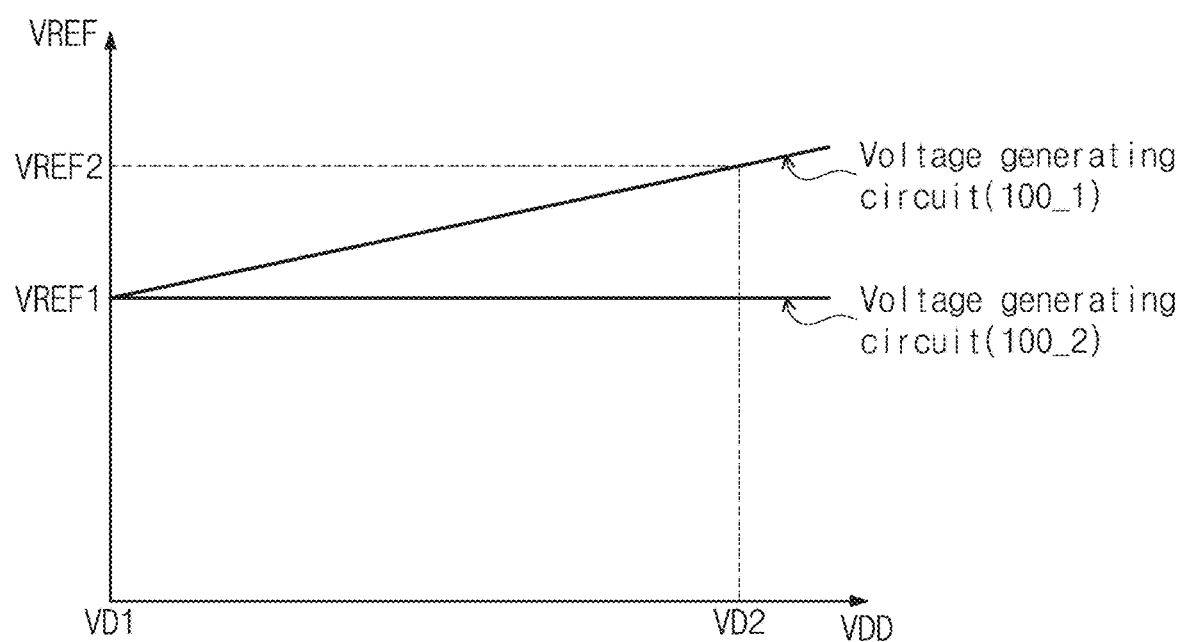
FIG. 5 is a graph illustrating a change in a level of a reference voltage relative to a level of an operating voltage.

FIG. 5 is a graph illustrating a change in a level of a reference voltage relative to a level of an operating voltage. In an example of FIG. 5, an x-axis represents a level of the operating voltage VDD, and a y-axis represents a level of the reference voltage VREF.

Referring to FIG. 5, as a level of the operating voltage VDD increases, a level of the reference voltage VREF that is output from the voltage generating circuit 100_1 may increase. Returning to FIG. 2, when the level of the operating voltage VDD increases, a level of a current flowing through the voltage generating circuit 110_1 may increase, and a level of the potential difference V1_1 may increase. Accordingly, the level of the reference voltage VREF that is output from the node ND1 may increase. In an example of FIG. 5, when the level of the operating voltage VDD increases from VD1 to VD2, the level of the reference voltage VREF that is output from the voltage generating circuit 100_1 of FIG. 2 may increase from VREF1 to VREF2.

As described with reference to FIG. 4, even though the level of the operating voltage VDD changes, the level of the reference voltage VREF may be uniformly maintained by the operations of the current supplying circuit 110_2. In the example of FIG. 5, when the level of the operating voltage VDD increases from VD1 to VD2, the level of the reference voltage VREF may be maintained at VREF1. That is, the voltage generating circuit 100_2 including the current supplying circuit 110_2 may output the reference voltage VREF having high stability relative to the operating voltage VDD.

For better understanding, an ideal embodiment in which a level of the reference voltage VREF output from the voltage generating circuit 100_2 does not change depending on a level of the operating voltage VDD is described with reference to FIG. 5, but it may be understood that a level of the reference voltage VREF output from the voltage generating circuit 100_2 may minutely change depending on a level of the operating voltage VDD.

Below, an exemplary relationship between a channel width and a threshold voltage of a transistor and an exemplary relationship between a channel length and a threshold voltage of a transistor will be described with reference to FIGS. 6 and 7. Below, an exemplary relationship between threshold voltages of the transistors MP1 to MP3 and a level of the reference voltage VREF will be described with reference to FIGS. 8 and 9.

Figure 6:
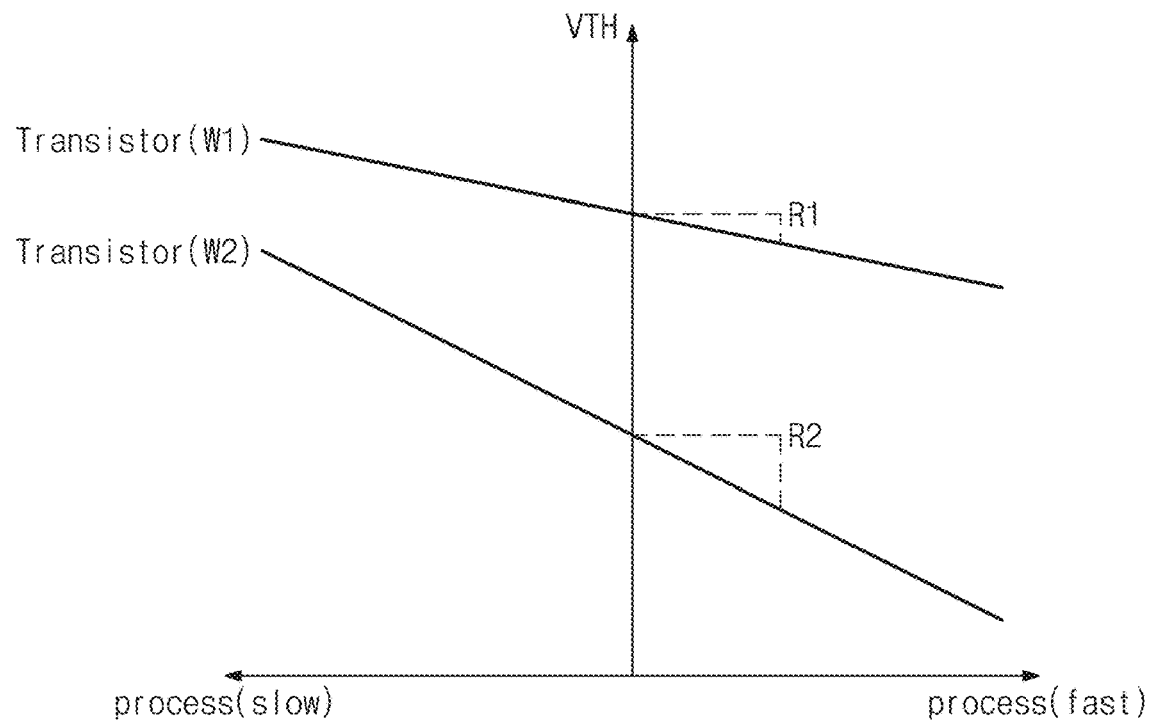
FIG. 6 is a graph illustrating a relationship between a channel width and a threshold voltage of a transistor.

FIG. 6 is a graph illustrating a relationship between a channel width and a threshold voltage of a transistor. In an example of FIG. 6, an x-axis represents a process error (fast process error and/or slow process error), and a y-axis represents a level of a threshold voltage.

As a fast process error increases, the number of carriers that are included in a transistor may decrease. Accordingly, as the fast process error increases, a level of a threshold voltage of the transistor may decrease. In the example of FIG. 6, as the fast process error increases, levels of threshold voltages of a transistor having a channel width of "W1" and a transistor having a channel width of "W2" may decrease.

As a size of a transistor increases, the influence of a process error on an element value of the transistor may decrease. For example, as a channel width of a transistor increases, the rate of change in a level of a threshold voltage relative to a process error may become smaller.

In the example of FIG. 6, in the case of a transistor (e.g., MP1) having a channel width of "W1", the rate of change in a level of a threshold voltage relative to a fast process error may be "R1". In the case of a transistor (e.g., MP2 and MP3) having a channel width of "W2", the rate of change in a level of a threshold voltage relative to a fast process error may be "R2". As described with reference to FIG. 2, "W1" may be greater than "W2", and thus, the rate of change "R1" may be smaller than the rate of change "R2".

Figure 7:
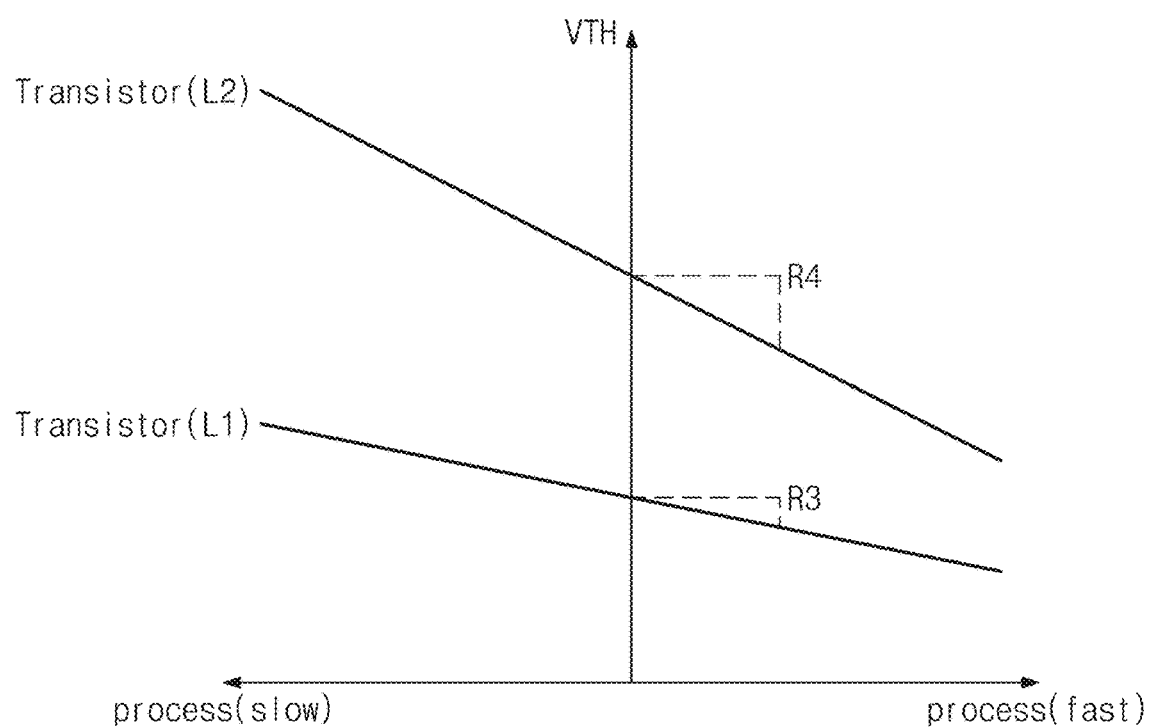
FIG. 7 is a graph illustrating a relationship between a channel length and a threshold voltage of a transistor.

FIG. 7 is a graph illustrating a relationship between a channel length and a threshold voltage of a transistor. In an example of FIG. 7, an x-axis represents a process error (fast process error and/or slow process error), and a y-axis represents a level of a threshold voltage.

In the example of FIG. 7, as a fast process error increases, a level of a threshold voltage of a transistor having a channel length of "L1" and a level of a threshold voltage of a transistor having a channel length of "L2" may decrease. As a size of a transistor increases, the influence of a process error on an element value of the transistor may decrease. For example, as a channel length of a transistor increases, the rate of change in a level of a threshold voltage relative to a process error may become smaller.

In the case of a transistor (e.g., MP1) having a channel length of "L1", the rate of change in a level of a threshold voltage relative to a fast process error may be "R3". In the case of a transistor (e.g., MP2 and MP3) having a channel length of "L2", the rate of change in a level of a threshold voltage relative to a fast process error may be "R4". As described with reference to FIG. 2, "L1" may be greater than "L2", and thus, the rate of change "R3" may be smaller than the rate of change "R4".

As described with reference to FIGS. 7 and 8, as a size of a transistor increases, that is, as a channel width of a transistor becomes greater and a channel length of the transistor becomes longer, the rate of change in a level of a threshold voltage relative to a fast process error may become smaller.

Figure 8:
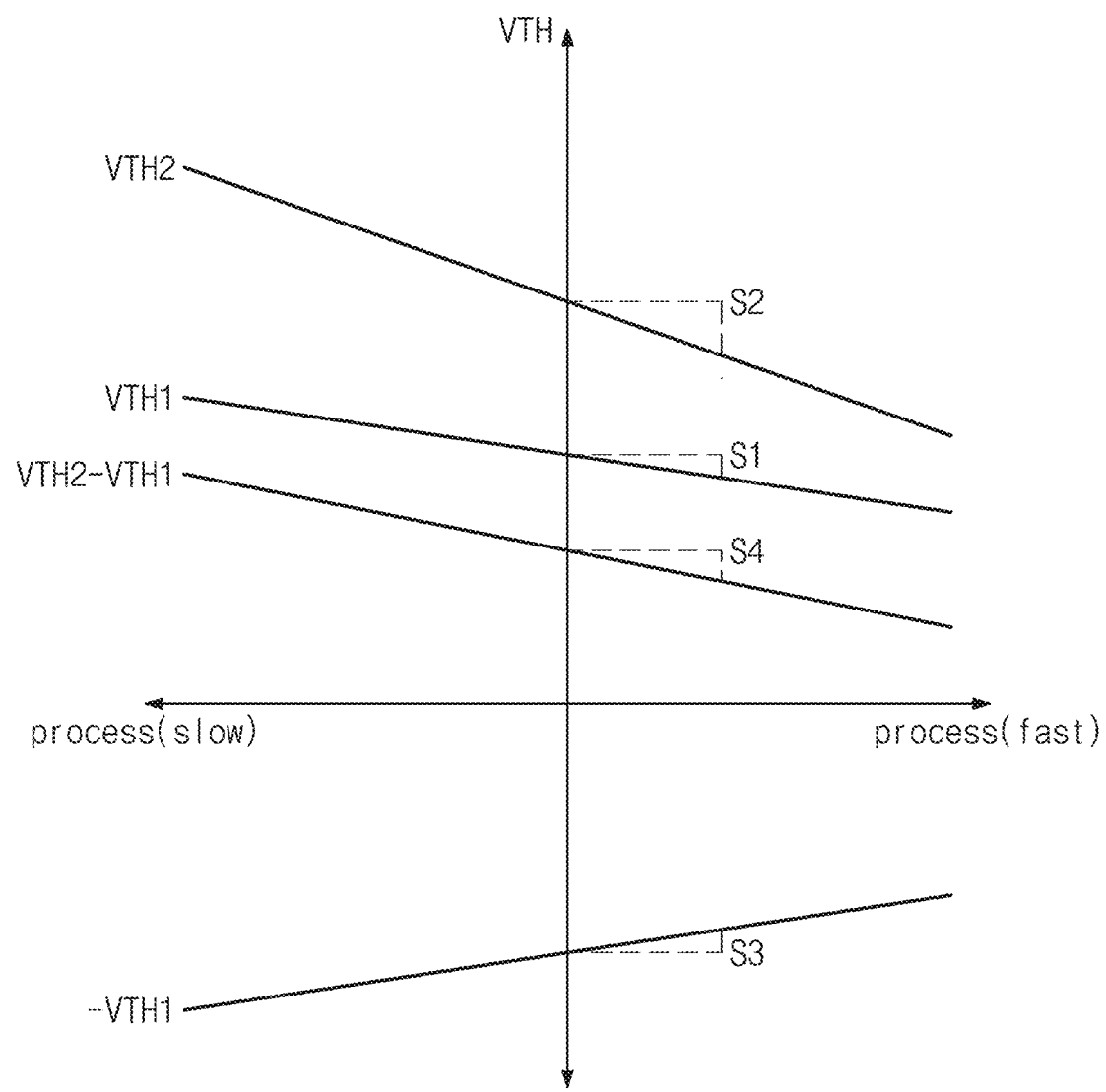
FIG. 8 is a graph illustrating a change in a level of a threshold voltage relative to a process error.

FIG. 8 is a graph illustrating a change in a level of a threshold voltage relative to a process error. In an example of FIG. 8, an x-axis represents a process error (fast process error and/or slow process error), and a y-axis represents a level of a threshold voltage.

As described with reference to FIGS. 2 and 3, the transistor MP1 may have a threshold voltage of "VTH1", and the transistors MP2 and MP3 may have a threshold voltage of "VTH2". "W1" being a channel width of the transistor MP1 may be greater than "W2" being a channel width of the transistors MP2 and MP3. Alternatively, "L1" being a channel length of the transistor MP1 may be longer than "L2" being a channel length of the transistors MP2 and MP3. Alternatively, "W1" being the channel width of the transistor MP1 may be greater than "W2" being the channel width of the transistors MP2 and MP3, and "L1" being the channel length of the transistor MP1 may be longer than "L2" being the channel length of the transistors MP2 and MP3. Accordingly, "S1" being the rate of change in a level of the threshold voltage VTH1 relative to a fast process error may be smaller than "S2" being the rate of change in a level of the threshold voltage VTH2 relative to a fast process error.

Accordingly, as a fast process error increases, "VTH2−VTH1" that is obtained by subtracting the level of the threshold voltage VTH1 from the level of the threshold voltage VTH2 may decrease. In the example of FIG. 8, the rate of change in "VTH2−VTH1" relative to a fast process error may be "S4". For example, "VTH2−VTH1" may be inversely proportional to a fast process error with a slope of "−S4". Accordingly, in Equation 1 above, "VTH2−VTH1" may be expressed by "VCTFP" that is inversely proportional to a fast process error.

Also, in Equation 1 above, because "VT" is proportional to a temperature, $$"m2 \times VT\ln\left(\frac{W1 \times L2}{W2 \times L1}\right) m2 \times VT\ln\left(\frac{W1 \times L2}{W2 \times L1}\right)"$$

may be expressed bye "VPTAT" proportional to a temperature. Accordingly, a level of the potential difference V2 may be expressed by Equation 3 below. A relationship between the level of the potential difference V2 and a temperature will be described with reference to FIG. 10.

$$V2 \cong VCTFP + VPTAT \qquad \text{[Equation 3]}$$

As a fast process error increases, the threshold voltages VTH1 and VTH2 of the transistors MP1 to MP3 may decrease. In the example of FIG. 8, the levels of the threshold voltages VTH1 and VTH2 may be inversely proportional to a fast process with slopes of "S1" and "S2", respectively. Accordingly, as a fast process error increases, "−VTH1" having a different sign from the level of the threshold voltage VTH1 may increase. In the example of FIG. 8, the rate of change in "−VTH1" relative to a fast process error may be "S3". For example, "VTH1" may be proportional to a fast process error with a slope of "S3".

Accordingly, as a fast process error increases, $$"\left(VBG - \frac{VTH1}{m1}\right)"$$

may increase. For example, $$"\left(VBG - \frac{VTH1}{m1}\right)"$$

may be proportional to a fast process error. Accordingly, $$"\left(VBG - \frac{VTH1}{m1}\right)"$$

may be expressed by "VPTFP" proportional to a fast process error.

Also, in Equation 2 above, because "VT" is proportional to a temperature, $$"-VT\ln k \times T^2 - VT\ln k \times T^2 m2 \times VT\ln\left(\frac{W1}{W2}\right)"$$

may be expressed by "VCTAT" inversely proportional to a temperature. Accordingly, a level of the potential difference V3 may be expressed by Equation 4 below. A relationship between the level of the potential difference V3 and a temperature will be described with reference to FIG. 10.

$$V3 \cong VPTFP + VCTAT \qquad \text{[Equation 4]}$$

Figure 9:
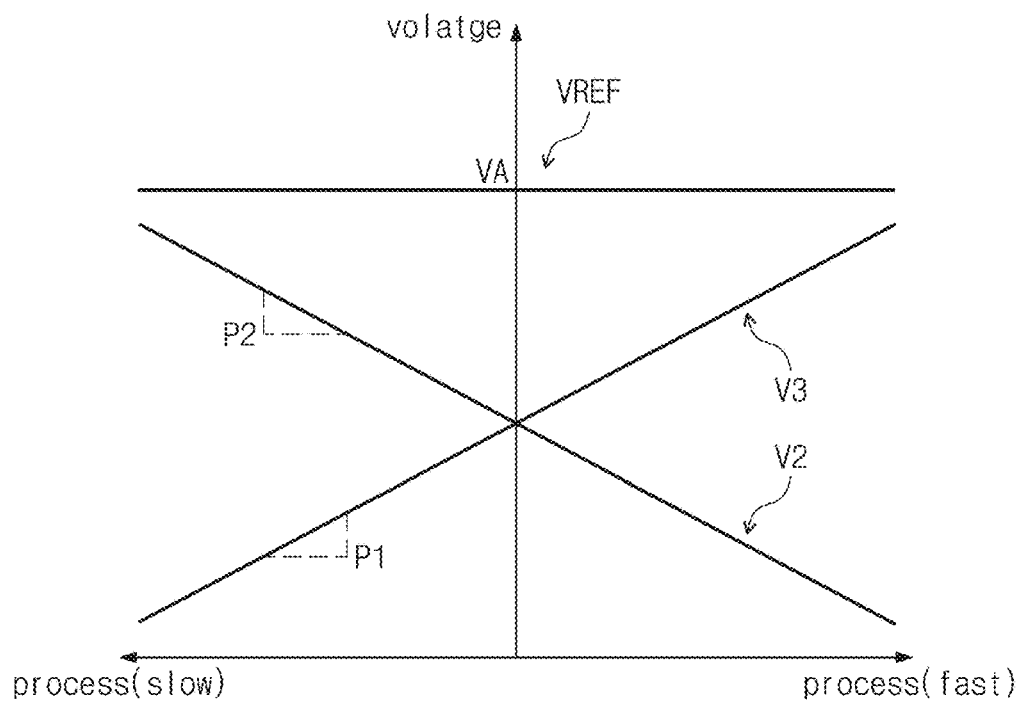
FIG. 9 is a graph illustrating a change in levels of potential differences of FIG. 2 or 3 relative to a process error.

FIG. 9 is a graph illustrating a change in levels of potential differences of FIG. 2 or 3 relative to a process error. In an example of FIG. 9, an x-axis represents a temperature, and a y-axis represents a level of a voltage or a potential difference.

As described with reference to Equation 3 above, because a level of the potential difference V2 includes "VCTFP", the level of the potential difference V2 may decrease as a fast process error increases. The rate of change in the level of the potential difference V2 relative to a fast process error may be "P2". For example, the level of the potential difference V2 may be inversely proportional to a fast process error with a slope of "−P2".

As described with reference to Equation 4 above, because a level of the potential difference V3 includes "VPTFP", the level of the potential difference V3 may increase as a fast process error increases. The rate of change in the level of the potential difference V3 relative to a fast process error may be "P1". For example, the level of the potential difference V3 may be proportional to a fast process error with a slope of "P1".

As a fast process error increases, the level of the potential difference V2 may decrease, and the level of the potential difference V3 may increase. This may mean that a sum of the levels of the potential differences V2 and V3 is uniform regardless of a fast process error. Because a level of the reference voltage VREF is decided based on the sum of the levels of the potential differences V2 and V3, the level of the reference voltage VREF may be uniform regardless of a fast process error. In the example of FIG. 9, the level of the reference voltage VREF may be "VA" regardless of a fast process error.

Accordingly, even though a fast process error occurring in manufacturing the voltage generating circuit 100 changes, the level of the reference voltage VREF that is output from the voltage generating circuit 100 thus manufactured may be uniform. The description is given in FIG. 9 as the level of the reference voltage VREF does not change, but it may be understood that the level of the reference voltage VREF minutely changes as a fast process error changes. Accordingly, the voltage generating circuit 100 may output the reference voltage VREF having a stable level relative to a process error.

Figure 10:
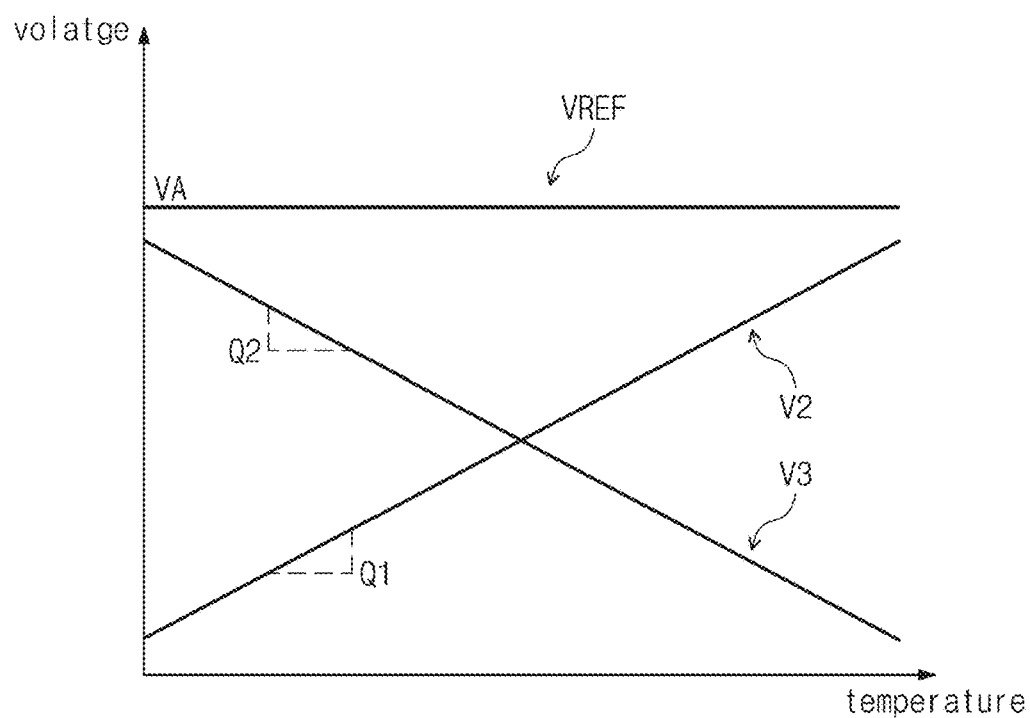
FIG. 10 is a graph illustrating a change in levels of potential differences of FIG. 2 or 3 relative to a temperature.

FIG. 10 is a graph illustrating a change in levels of potential differences of FIG. 2 or 3 relative to a temperature.

As described with reference to Equation 3 above, because a level of the potential difference V2 includes "VPTAT", the level of the potential difference V2 may increase as a fast process error increases. The rate of change in the level of the potential difference V2 relative to a temperature may be "Q1". For example, the level of the potential difference V2 may be proportional to a fast process error with a slope of "Q1".

As described with reference to Equation 4 above, because a level of the potential difference V3 includes "VCTAT", the level of the potential difference V3 may decrease as a fast process error increases. The rate of change in the level of the potential difference V3 relative to a temperature may be "Q2". For example, the level of the potential difference V3 may be inversely proportional to a fast process error with a slope of "−Q2".

As a temperature increases, the level of the potential difference V2 may increase, and the level of the potential difference V3 may decrease. This may mean that a sum of the levels of the potential differences V2 and V3 is uniform regardless of a temperature. Because a level of the reference voltage VREF includes the sum of the levels of the potential differences V2 and V3, the level of the reference voltage VREF may be uniform regardless of a temperature. In the example of FIG. 10, the level of the reference voltage VREF may be "VA" regardless of a temperature.

Accordingly, even though a temperature of the voltage generating circuit 100 changes, the level of the reference voltage VREF that is output from the voltage generating circuit 100 may be uniform. The description is given in FIG. 10 as the level of the reference voltage VREF does not change, but it may be understood that the level of the reference voltage VREF minutely changes as a temperature changes. Accordingly, the voltage generating circuit 100 may output the reference voltage VREF having a stable level relative to a temperature.

According to an embodiment of the inventive concept, a level of a reference voltage that is generated from an electronic circuit may be stably maintained.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. An electronic circuit comprising:
   a first transistor having a first channel width and a first channel length, and configured to generate a first potential difference by passing an operating current based on a first operating voltage;
   a second transistor having a second channel width and a second channel length, and configured to generate a second potential difference based on the operating current; and
   a third transistor configured to generate a third potential difference based on a second operating voltage and the operating current,
   wherein a difference between a level of the first operating voltage and a level of the first potential difference corresponds to a sum of a level of the second operating voltage, a level of the second potential difference, and a level of the third potential difference, and
   wherein the first channel width is greater than the second channel width, or the first channel length is longer than the second channel length.

2. The electronic circuit of claim 1, further comprising:
   a fourth transistor having a third channel width and a third channel length and connected between the second transistor and the third transistor.

3. The electronic circuit of claim 2, wherein the first channel width is greater than the third channel width, or the first channel length is longer than the third channel length.

4. The electronic circuit of claim 1, further comprising:
   a fifth transistor connected in series with the first transistor, and configured to pass the operating current to the first transistor based on the first operating voltage.

5. The electronic circuit of claim 4, wherein a level of a threshold voltage of the fifth transistor is lower than a level of a threshold voltage of the first transistor and a level of a threshold voltage of the second transistor.

6. The electronic circuit of claim 1, wherein, as a process error increases, the level of the second potential difference decreases, and the level of the third potential difference increases.

7. The electronic circuit of claim 6, wherein the process error is associated with dopant concentration of the first transistor, the second transistor, and the third transistor.

8. The electronic circuit of claim 1, wherein the level of the second potential difference is inversely proportional to a process error, and the level of the third potential difference is proportional to the process error.

9. The electronic circuit of claim 1, wherein, as a temperature increases, the level of the second potential difference increases, and the level of the third potential difference decreases.

10. The electronic circuit of claim 1, wherein the level of the second potential difference is proportional to a temperature, and the level of the third potential difference is inversely proportional to the temperature.

11. An electronic circuit comprising:
    a first transistor having a first size and a first threshold voltage associated with the first size, and configured to generate a first potential difference based on a first operating voltage;
    a second transistor having a second size smaller than the first size and a second threshold voltage associated with the second size, and configured to generate a second potential difference; and
    a third transistor configured to generate a third potential difference based on a second operating voltage,
    wherein the second potential difference decreases as a process error increases, and the third potential difference increases as the process error increases.

12. The electronic circuit of claim 11, wherein the first size is associated with a channel width of the first transistor and a channel length of the first transistor, and the second size is associated with a channel width of the second transistor and a channel length of the second transistor.

13. The electronic circuit of claim 11, wherein, when a level of the first operating voltage changes as much as a first value, a difference between the level of the first operating voltage and a level of the first potential difference changes as much as a second value smaller than the first value.

14. The electronic circuit of claim 11, wherein, when a level of the third potential difference changes as much as a third value as a temperature changes, a sum of a level of the second potential difference and the level of the third potential difference changes as much as a fourth value smaller than the third value.

15. The electronic circuit of claim 11, wherein, when a level of the third potential difference changes as much as a fifth value as the process error changes, a sum of a level of the second potential difference and the level of the third potential difference changes as much as a sixth value smaller than the fifth value.

16. An electronic circuit comprising:
    a first transistor having a first size and a first threshold voltage associated with the first size, and configured to generate a first potential difference based on a first operating voltage;
    a second transistor having a second size smaller than the first size and a second threshold voltage associated with the second size, and configured to generate a second potential difference having a level decided based on a difference between a level of the first threshold voltage and a level of the second threshold voltage; and a third transistor configured to generate a third potential difference having a level decided based on the first potential difference.

17. The electronic circuit of claim 16, wherein the level of the third potential difference is inversely proportional to the level of the first threshold voltage.

18. The electronic circuit of claim 16, further comprising:
a fourth transistor connected in series with the first transistor and having a threshold voltage having a level smaller than the level of the first threshold voltage.

19. The electronic circuit of claim 18, wherein the first transistor and the second transistor are a P-type metal oxide semiconductor field effect transistor (MOSFET), the third transistor is a bipolar junction transistor (BJT), and the fourth transistor is an N-type MOSFET.

20. The electronic circuit of claim 16, further comprising:
a fifth transistor connected in series with the second transistor and having a third size corresponding to the second size and a third threshold voltage corresponding to the second threshold voltage.

* * * * *